(12) United States Patent
Thiele et al.

(10) Patent No.: US 8,638,133 B2
(45) Date of Patent: Jan. 28, 2014

(54) METHOD AND CIRCUIT FOR DRIVING AN ELECTRONIC SWITCH

(75) Inventors: Steffen Thiele, Munich (DE); Andreas Peter Meiser, Sauerlach (DE); Franz Hirler, Isen (DE)

(73) Assignee: Infineon Technologies AG, Neubiberg (DE)

( * ) Notice: Subject to any disclaimer, the term of this patent is extended or adjusted under 35 U.S.C. 154(b) by 167 days.

(21) Appl. No.: 13/160,809

(22) Filed: Jun. 15, 2011

(65) Prior Publication Data

US 2012/0319740 A1 Dec. 20, 2012

(51) Int. Cl.
*H03K 3/00* (2006.01)

(52) U.S. Cl.
USPC .................... 327/109; 327/309; 327/427

(58) Field of Classification Search
USPC .......................... 327/109, 309, 427
See application file for complete search history.

(56) References Cited

U.S. PATENT DOCUMENTS

| | | | |
|---|---|---|---|
| 5,581,432 A * | 12/1996 | Wellnitz et al. | 361/56 |
| 6,700,428 B2 | 3/2004 | Sander | |
| 7,453,308 B2 * | 11/2008 | Tihanyi | 327/309 |
| 7,576,964 B2 * | 8/2009 | Nakahara | 361/91.1 |
| 8,116,052 B2 * | 2/2012 | Nakahara | 361/91.7 |
| 2005/0088216 A1 * | 4/2005 | Arndt et al. | 327/325 |

FOREIGN PATENT DOCUMENTS

| | | |
|---|---|---|
| DE | 100 61 371 A1 | 6/2002 |
| DE | 10239689 A1 | 3/2004 |
| DE | 103 45 556 A1 | 5/2005 |
| DE | 102007041784 A1 | 3/2009 |
| WO | 2009030691 A1 | 3/2009 |

OTHER PUBLICATIONS

Infineon, "OptiMOS®—T2 Power-Transistor", IPD5ONO6S4L-12, Rev. 1.0, Mar. 23, 2009, pp. 1-9.

* cited by examiner

*Primary Examiner* — Ryan Jager
(74) *Attorney, Agent, or Firm* — Murphy, Bilak & Homiller, PLLC

(57) ABSTRACT

Disclosed is an electronic circuit. The electronic circuit includes a transistor having a control terminal to receive a drive signal, and a load path between a first and a second load terminal. A voltage protection circuit is coupled to the transistor, has a control input, is configured to assume one of an activated state and a deactivated state as an operation state dependent on a control signal received at the control input, and is configured to limit a voltage between the load terminals or between one of the load terminals and the control terminal. A control circuit is coupled to the control input of the voltage protection circuit and is configured to deactivate the voltage protection circuit dependent on at least one operation parameter of the transistor and when a voltage across the load path or a load current through the load path is other than zero.

16 Claims, 4 Drawing Sheets

METHOD AND CIRCUIT FOR DRIVING AN ELECTRONIC SWITCH

TECHNICAL FIELD

Embodiments of the present application relate to an electronic circuit, in particular an electronic circuit with a transistor and a voltage protection circuit, and to a method for driving a transistor.

BACKGROUND

Transistors, such as MOSFETs (metal oxide semiconductor field effect transistors) or IGBTs (insulated gate bipolar transistors), are widely used as electronic switches for switching electronic loads. For this, a load path of the transistor is connected in series with the load between terminals for a supply voltage, where the load is switched on when the transistor is in an on-state (switched on) and is switched off when the transistor is in an off-state (switched off).

When the load is an inductive load, such as, e.g., a motor, a magnetic valve, or a choke, the load stores magnetic energy when the switching element is in its on-state. This energy may result in a high voltage across the load path of the transistor after switching off, unless measures are taken that allow this energy to dissipate. According to a first approach, a freewheeling circuit may be connected in parallel with the load that allows a current through the load to continue to flow until the energy is dissipated.

According to a second approach, the transistor itself is used to dissipate the energy. In this case, the transistor is operated in a high-ohmic state in which an on-resistance of the transistor is higher than in a normal operation state in order to dissipate the energy. Operating the transistor in the high-ohmic state may include a control process that controls a drive signal applied to the control terminal of the transistor such that a voltage between one of the load terminals and the control terminal of the transistor is limited to a given voltage value.

In the second approach, when the energy is dissipated in the transistor, the current through the transistor decreases and, according to the characteristic curve(s) of the transistor, the amplitude of the drive signal decreases. However, there are transistors in which instabilities may occur when these transistors are operated at low drive signals and/or at low load currents.

There is, therefore, a need to provide an electronic circuit with a transistor that is suitable to drive an inductive load and in which instabilities can be avoided, and to provide a method for a stable operation of a transistor.

SUMMARY

A first aspect relates to an electronic circuit including a transistor having a control terminal to receive a drive signal, and a load path between a first and a second load terminal. A voltage protection circuit is coupled to the transistor, includes a control input, is configured to assume one of an activated state and a deactivated state as an operation state dependent on a control signal received at the control input, and is configured to limit a voltage between the load terminals or between one of the load terminals and the control terminal. A control circuit is coupled to the control input of the voltage protection circuit and is configured to deactivate the voltage protection circuit dependent on at least one operation parameter of the transistor and when a voltage across the load path or a load current through the load path is other than zero.

A second aspect relates to a method of driving a transistor having a control terminal to receive a drive signal, a load path between a first and a second load terminal, and an avalanche breakthrough voltage. The method includes switching off the transistor and limiting a voltage between the load terminals or between one of the load terminals and the control terminal to a threshold voltage below the avalanche breakthrough voltage by driving the transistor in an on-state. The method further includes deactivating the voltage limiting dependent on an operation parameter of the transistor and before a voltage across the load path or a load current through the load path has decreased to zero.

Those skilled in the art will recognize additional features and advantages upon reading the following detailed description, and upon viewing the accompanying drawings.

BRIEF DESCRIPTION OF THE DRAWINGS

Embodiments will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Figure 1:
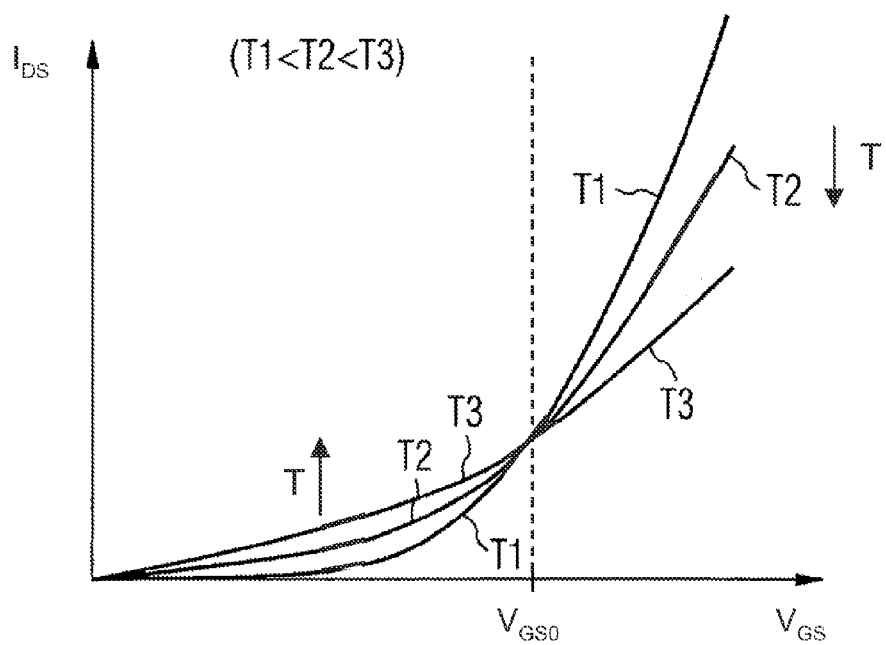
FIG. 1 schematically illustrates characteristic curves of a MOSFET illustrating the dependency of a load current (drain-source-current) on a drive signal (gate-source voltage).

FIG. 1 schematically illustrates characteristic curves of a MOS-transistor, such as a MOSFET or an IGBT. In FIG. 1, three different characteristic curves are shown each illustrating the dependency of a load current $I_{DS}$ on a drive signal or drive voltage $V_{GS}$. The load current is, e.g., a drain-source current in a MOSFET or a collector-emitter current in an IGBT. The drive signal is, e.g., a gate-source voltage in an MOSFET or a gate-emitter voltage of an IGBT. FIG. 1 illustrates the characteristic curves obtained at three different temperatures T1, T2, T3, with T1<T2<T3. As can be seen from FIG. 1, the threshold voltage, which is the drive voltage at which the transistor starts to conduct the load current $I_{DS}$ is dependent on the temperature and decreases with decreasing temperature. At higher values of the drive voltage $V_{GS}$ the load current $I_{DS}$ decreases with increasing temperature T, which results from a lower charge carrier mobility at higher temperatures. These two effects, namely the decreasing threshold voltage with decreasing temperature and the decreasing load current $I_{DS}$ at increasing temperature, result in a temperature stable point that is defined by a drive signal $V_{GS0}$ at which the load current $I_{DS}$ is independent of the temperature.

As can be seen from FIG. 1, a rising temperature at a drive signal $V_{GS}$ below $V_{GS0}$ results in an increasing load current $I_{DS}$. Since a rising load current may result in a rising temperature of the transistor, there is a positive thermal feedback at drive signals below the stable point $V_{GS0}$. At drive signals $V_{GS}$ above $V_{GS0}$ there is a negative thermal feedback, because at these drive signals the load current $I_{DS}$ decreases with increasing temperature.

Operating the transistor at drive signals $V_{GS}$ below the stable point $V_{GS0}$ may result in instabilities such that a rising load current $I_{DS}$ may result in a rising temperature, which again may result in an increase of the current. In particular in a transistor with a cell structure, which is a transistor having a plurality of transistor cells connected in parallel, the temperature distribution in the transistor may be not homogenous. In this case, operating the transistor at drive signals at which a positive thermal feedback may occur, may have the effect that transistor cells having the highest temperature take the highest share of the current flowing through the transistor. Taking the highest share of the current may result in a further heating of these transistor cells, which in turn may result in a yet higher share of the current flowing through these transistor cells until one or more of the transistor cells are destroyed. This effect is known as current filamentation.

Current filamentation can be prevented when the drive signal is generated to be always above the temperature stable point $V_{GS0}$. However, operation scenarios may occur in which this cannot be guaranteed. Further, in some types of MOS transistors the temperature stable point $V_{GS0}$ is at considerably high values of the drive signal $V_{GS}$, which makes this problem even worse.

Figure 2:
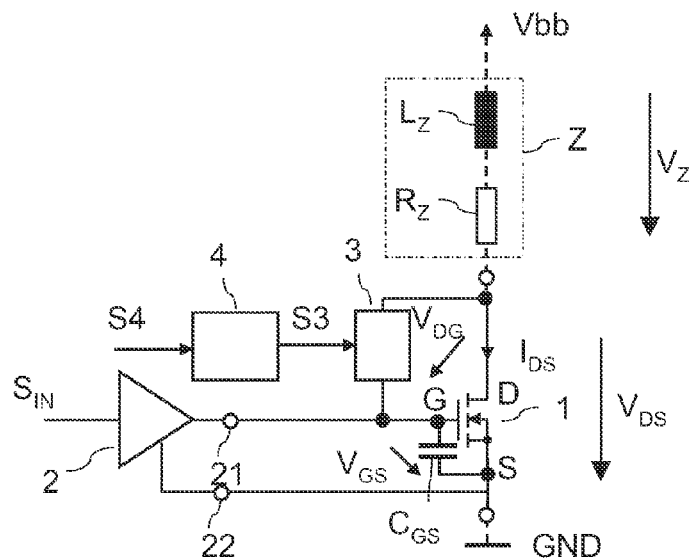
FIG. 2 schematically illustrates an embodiment of an electronic circuit including a transistor, a voltage protection circuit and a control circuit for the voltage protection circuit.

FIG. 2 illustrates a circuit diagram of an electronic circuit with a transistor 1. As illustrated in dashed lines in FIG. 2, the transistor 1 may be used as an electronic switch for switching an electronic load Z. For this, a load path D-S of the transistor 1 is connected in series with the load Z, where the series circuit with the transistor 1 and the load Z is connected between terminals for positive supply potential Vbb and a negative supply potential or reference potential GND. In the embodiment illustrated in FIG. 2, the transistor 1 is connected as a low-side switch, which is a switch connected between a load, such as load Z in FIG. 2, and a negative supply potential, such as the negative supply potential or reference potential GND in FIG. 2. However, this is only an example. The transistor 1 could also be connected as a high-side switch which is a switch connected between the terminal for the positive supply potential and the load.

The transistor 1 according to FIG. 2 is a MOSFET, specifically an n-type MOSFET. However, this is only an example. The transistor 1 could also be implemented as a p-type MOSFET or as an IGBT. Thus, the explanation provided in the following with reference to the n-type MOSFET also applies to a p-type MOSFET and to an IGBT, where in a p-type MOSFET the polarity of voltages explained below have to be inverted.

The transistor 1 has a control terminal G, which is a gate terminal in the MOSFET, and has two load terminals D, S, which are drain and source terminals in the MOSFET, respectively. In an IGBT the corresponding terminals are gate, collector and emitter terminals, respectively. The load path D-S is an internal path of the transistor between the load terminals D, S.

The transistor 1, which is implemented as a MOSFET or as an IGBT, can be used as a voltage-controlled switch that switches on and off dependent on a drive signal or drive voltage $V_{GS}$, which is a voltage between the control terminal G and one of the load terminals D, S. In a MOSFET the drive voltage is the gate-source voltage $V_{GS}$ between the gate and the source terminals G, S. The electronic circuit includes a drive circuit 2 which is configured to generate the drive voltage $V_{GS}$ dependent on an input signal $S_{IN}$. The input signal $S_{IN}$ may be a logic signal that can assume two different signal levels, namely an on-level and an off-level. The drive circuit 2 is configured to generate the drive voltage $V_{GS}$ dependent on the input signal $S_{IN}$ such that the transistor 1 switches on when the input signal $S_{IN}$ has an on-level and such that the transistor 1 switches off when the input signal $S_{IN}$ has an off-level. In an n-type MOSFET, as illustrated in FIG. 2, the drive voltage $V_{GS}$ that switches the transistor 1 on is a voltage above a threshold voltage of the MOSFET, and a drive voltage $V_{GS}$ that switches the transistor 1 off is a voltage below the threshold voltage. The threshold voltage is, e.g., in the range of between 0.7V and 1.5V in a silicon MOSFET.

According to one embodiment, the drive circuit 2 is configured to drive the transistor 1 in a low-ohmic on-state when the input signal has an on-level. The term "low-ohmic on-state" refers to an on-state in which an on-resistance of the transistor 1 has a minimum or is close to the minimum. The gate-source-voltage $V_{GS}$ to be applied to drive the transistor 1 in the low-ohmic on-state is usually significantly higher than the threshold voltage. According to one embodiment, the gate-source-voltage $V_{GS}$ for driving the transistor 1 in the low-ohmic on-state is between 5V and 20V, in particular between 10V and 15V. The drive voltage $V_{GS}$ for switching the transistor 1 off is, e.g., 0V.

The electronic circuit 1 further includes a voltage protection circuit 3 coupled to the transistor 1. In the embodiment illustrated in FIG. 2, the voltage protection circuit 3 is connected between the drain terminal D and the gate terminal G of the MOSFET 1. The voltage protection circuit 3 further includes a control input for receiving a control signal S3 and is configured to assume one of an activated state and a deactivated state dependent on the control signal S3. In the activated state the voltage protection circuit 3 is configured to limit a voltage between the drain terminal D and the gate terminal G to a given maximum voltage value. The voltage protection circuit 3 together with the transistor 1 forms a control loop in which the transistor 1 is driven in an on-state by the voltage protection circuit 3 when the voltage between the drain terminal D and the gate terminal G reaches the maximum voltage value when the transistor 1 is in its off-state. Limiting the voltage $V_{DG}$ between the drain terminal D and the gate terminal G to the maximum value is approximately equivalent to limiting the drain-source voltage $V_{DS}$ to the maximum value.

The voltage protection circuit 3 is activated and deactivated dependent on the control signal S3 which is generated by a control circuit 4. The control circuit 4 activates and deactivates the voltage protection circuit 3 dependent on at least one operation parameter S4 of the transistor 1. This operation parameter S4 is at least one of: the amplitude of the drive voltage $V_{GS}$; a slope $dV_{GS}/dt$ of the drive voltage; an amplitude of a load current $I_{DS}$ through the load path of the transistor 1, a slope $dI_{DS}/dt$ of the load current $I_{DS}$; the duration of an off-level of the input signal $S_{IN}$. This will be explained in further detail below.

Figure 3:
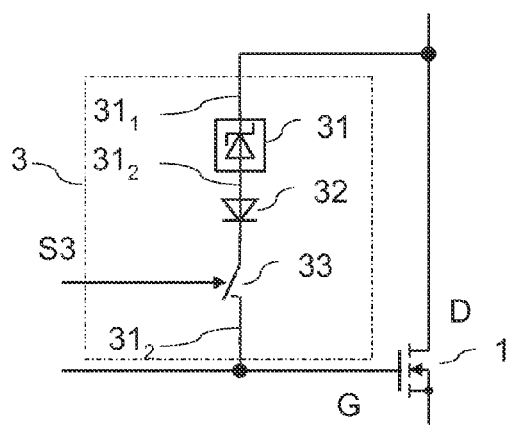
FIG. 3 schematically illustrates an embodiment of the voltage protection circuit.

FIG. 3 schematically illustrates an embodiment of the voltage protection circuit 3. In this embodiment, the voltage protection circuit 3 includes a diode arrangement 31 with at least one Zener diode or avalanche diode and a switching element 33 connected in series with the diode arrangement 31. The series circuit with the diode arrangement 31 and the switching element 33 is connected between the drain terminal D and the gate terminal G of the transistor 1. For illustration purposes, the transistor 1 is also illustrated in FIG. 3.

The switching element 33 has a load terminal connected in series with the diode arrangement 31 and a control terminal for receiving the control signal S3. In the embodiment illustrated in FIG. 3, the voltage protection circuit 3 is activated when the switching element 33 is in an on-state (switched on) as driven by the control signal S3, and the voltage protection circuit 3 is in a deactivated state when the switching element 33 is in an off-state (switched off). The switching element 33 can be implemented as a conventional electronic switch such as a MOSFET, an IGBT or a bipolar junction transistor (BJT).

Referring to FIG. 3, the voltage protection circuit 3 may include a further diode 32. The further diode 32 is connected in series with the diode arrangement 31 in such a way that a current flow from the control terminal G to the first load terminal D is prevented, in particular, when the transistor 1 is in its on-state.

The drive circuit 2 can be implemented as a conventional drive circuit that is configured to drive a transistor, specifically a MOSFET 1 as illustrated in FIG. 2, dependent on an input signal $S_{IN}$. However, for illustration purposes and for a better understanding of the operating principle of the voltage protection circuit 3, an embodiment of the drive circuit 2 will be explained with reference to FIG. 4. In this connection the drive circuit 2 illustrated in FIG. 4 only serves for illustration purposes with the understanding that a plurality of other types of drive circuits may be used instead.

Figure 4:
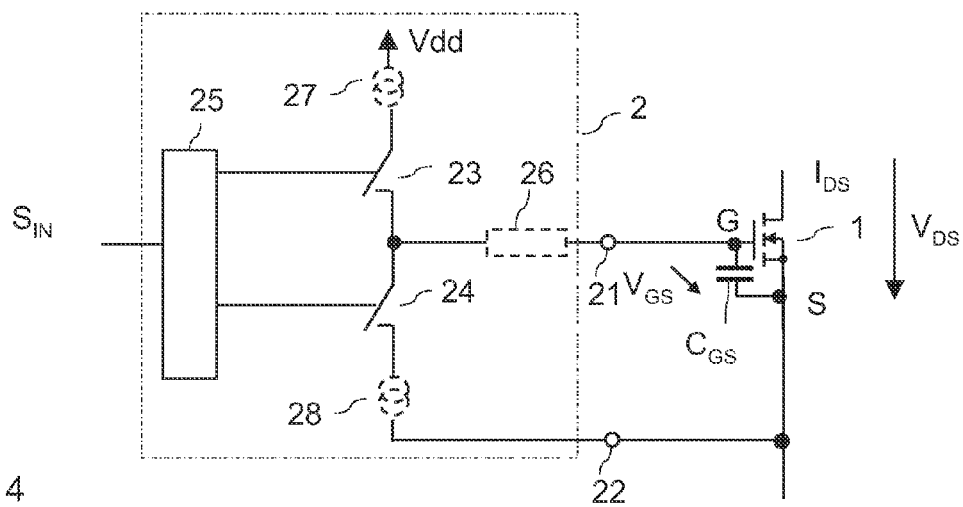
FIG. 4 schematically illustrates an embodiment of a drive circuit of the transistor.

The drive circuit of FIG. 4 includes a half-bridge circuit with a high-side switch 23 and a low-side switch 24 each having a load path and a control terminal. The load paths of the two switches 23, 24 are connected in series between a terminal for a drive potential Vdd and the second load terminal S of the transistor 1. The half-bridge circuit 23, 24 includes an output terminal, which is a circuit node common to the high-side switch 23 and the low-side switch 24. The output terminal of the half-bridge circuit is coupled to the control terminal G of the transistor 1 via a first output terminal 21 of the drive circuit 2. The half-bridge circuit is coupled to the second load terminal S of the transistor 1 via a second output terminal 22.

The drive circuit 2 further includes an internal drive circuit 25 for the high-side switch 23 and the low-side switch 24. The drive circuit 25 receives the input signal $S_{IN}$ and is configured to switch the half-bridge switches 23, 24 on and off dependent on the input signal $S_{IN}$. In general, the drive circuit 25 switches the two switches 23, 24 on and off complementarily, which means that the low-side switch 24 is switched off when the high-side switch 23 is switched on, and vice versa. However, the drive circuit 25 could be implemented to provide a dead time between the time of switching off one of the switching elements 23, 24 and switching on the other one of the switching elements 23, 24. In the embodiment illustrated in FIG. 4, in which the transistor 1 connected to the drive circuit 2 is an n-type MOSFET, the internal drive circuit 25 of the drive circuit 2 switches the high-side switch 23 on and the low-side switch 24 off, when the input signal $S_{IN}$ has an on-level, so that the transistor 1 is to be switched on. In this case, the drive potential Vdd is applied between the gate terminal G and the source terminal S of the transistor 1. When the input signal $S_{IN}$ has an off-level, the internal drive circuit 25 switches the high-side switch 23 off and the low-side switch 24 on so that the gate-source voltage $V_{GS}$ is zero.

Optionally, a resistor 26 (illustrated in dashed lines) is connected between the output of the half-bridge circuit 23, 24 and the gate terminal G of the transistor 1.

Optionally, current sources 27, 28 (also illustrated in dashed lines) are connected in series with the high-side switch 23 and the low-side switch 24, respectively. In this arrangement, a first current source 27 connected in series with the high-side-switch 23 defines a charging current of the gate-source-capacitance $C_{GS}$ when the high-side switch 23 is on so as to switch the transistor 1 on, and a second current source 28 connected in series with the low-side-switch 24 defines a discharging current of the gate-source-capacitance $C_{GS}$ when the low-side switch 24 is on so as to switch the transistor 1 off.

The operating principle of the electronic circuit of FIG. 2 is now explained with reference to FIG. 5 in which timing diagrams of the following signals are illustrated: the load-path voltage $V_{DS}$ of the transistor 1; the voltage $V_Z$ across the load Z; the input signal $S_{IN}$; the load-path current $I_{DS}$ of the transistor 1; the drive voltage or gate-source-voltage $V_{GS}$ of the transistor 1; and the control signal S3. The timing diagrams illustrated in FIG. 4 are only schematic diagrams. For illustration purposes it is assumed that the load Z is an inductive load which, referring to FIG. 2, at least includes an inductive component $L_Z$ and which may additionally include an ohmic component $R_Z$. The load Z is, for example, a motor, a magnetic valve, or a choke.

Figure 5:
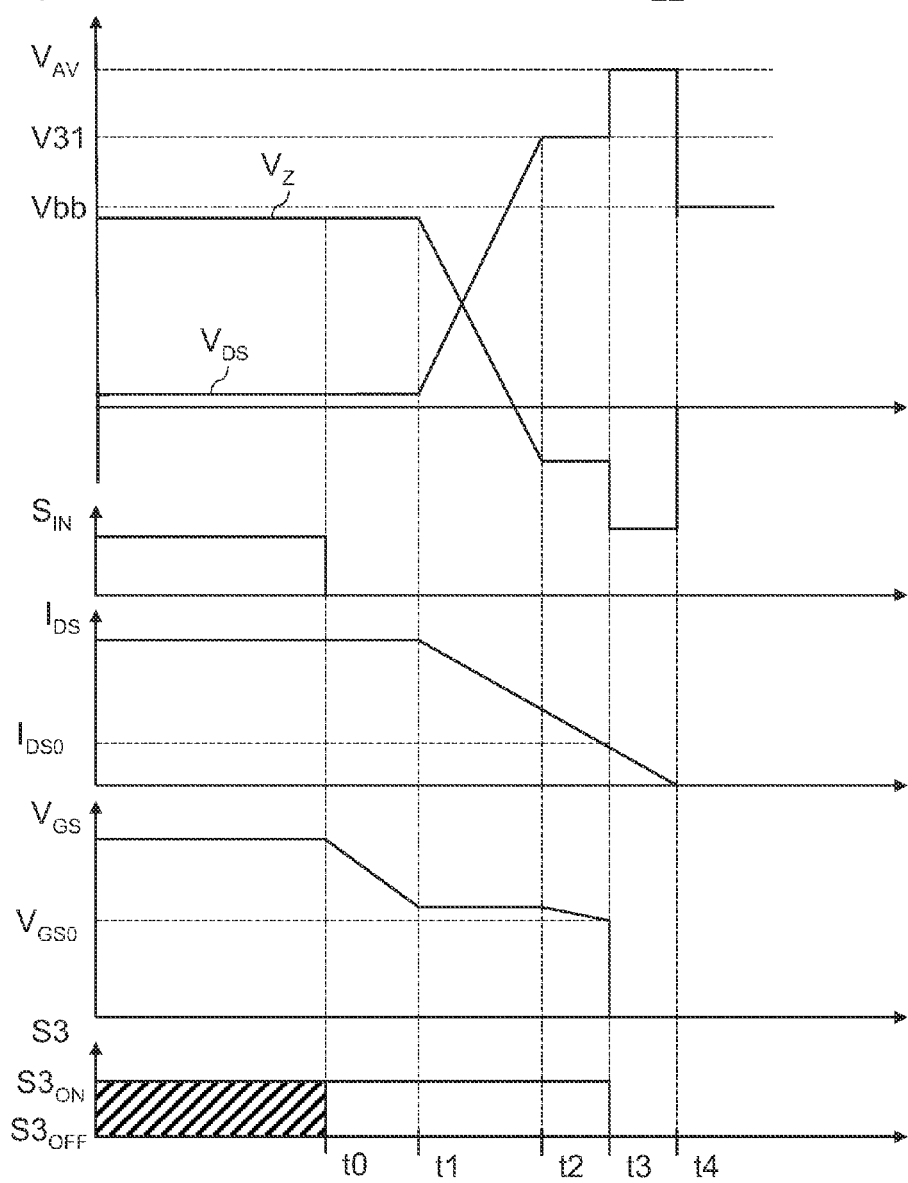
FIG. 5 shows timing diagrams illustrating the operating principle of the electronic circuit of FIG. 3.

The timing diagrams illustrated in FIG. 5 start at a time when the transistor 1 is switched on. At this time, the input signal $S_{IN}$ has an on-level, the voltage $V_{DS}$ across the transistor 1 has a minimum value that is defined by the on-resistance of the transistor 1 and the load current $I_{DS}$. The voltage $V_Z$ across the load Z is the supply voltage Vbb minus the load-path voltage $V_{DS}$ and is close to the supply voltage Vbb when the transistor 1 is in its on-state. The load current $I_{DS}$ is defined by the supply voltage Vbb and the load when the transistor 1 is in its on-state. The gate-source-voltage $V_{GS}$ has its maximum value which, referring to FIG. 4, is defined by the drive potential Vdd. When the transistor 1 is in its on-state electrical energy is stored in magnetic form in the inductive load Z.

In FIG. 5, t0 represents the time at which the input signal $S_{IN}$ switches to an off-level. At this time, referring to FIG. 4, the high-side-switch 23 of the drive circuit 4 is switched off and the low-side-switch 24 is switched on. However, the gate-source voltage $V_{GS}$ does not immediately drop to zero when the low-side-switch 24 is switched on. The transistor 1 internally has a gate-source-capacitance $C_{GS}$ that is schematically illustrated in FIG. 2. This gate-source-capacitance $C_{GS}$ is not immediately discharged when the low-side switch is switched on. The rate at which the gate-source capacitance $C_{GS}$ is discharged is, for example, dependent on its capacitance value, ohmic line resistances and the resistance of the optional output resistor 26 of the drive circuit 2. When the drive circuit 2 includes a current source, such as current source 28 illustrated in FIG. 4, the current provided by the current source defines the rate at which the gate-source capacitance $C_{GS}$ is discharged and, therefore, defines the rate at which the voltage $V_{GS}$ across the gate-source-capacitance $C_{GS}$ changes.

Referring to FIG. 5, at a time t1 the load-path voltage $V_{DS}$ of the transistor 1 starts to increase and the load voltage $V_Z$ starts to decrease. This is the time when the gate-source-capacitance $C_{GS}$ has been discharged to such an extent that the on-resistance of the transistor 1 significantly increases. At this time t1 the commonly known Miller effect sets in which keeps the gate-source-voltage $V_{GS}$ approximately constant for a time period which in FIG. 5 ends at time t2. This is the time at which the gate-source-voltage $V_{GS}$ is about to further decrease, so that the transistor 1 completely blocks. However, at this time t2 the voltage across the voltage protection circuit 3 reaches a maximum voltage value which causes the voltage protection circuit 3 to conduct in order to drive the transistor 1 on in a high-ohmic on-state. At this time, the gate-source-voltage $V_{GS}$ may be neglected, so that the drain-source-voltage $V_{DS}$ approximately equals the drain-gate-voltage $V_{DG}$, which, in turn, equals the voltage limiting voltage $V_{31}$ of the voltage protection circuit 3. This voltage limiting voltage $V_{31}$ is defined by the breakthrough voltage of the Zener or avalanche diode 31.

When the transistor 1 driven by the voltage protection circuit 3 is in the high-ohmic on-state, energy that was previously stored in the inductive load is dissipated in the transistor 1. This dissipation of electrical energy causes the load current $I_{DS}$ to decrease while the load-path voltage $V_{DS}$ is limited to the voltage limiting value $V_{31}$. According to a characteristic curve of a MOSFET, the gate-source-voltage $V_{GS}$ also decreases when the load current $I_{DS}$ decreases.

The voltage protection circuit 3 is activated before time t2 or at time t2 at which the voltage protection circuit 3 is required to limit the voltage across the transistor 1. According to one embodiment, the voltage protection circuit 3 is activated at time t0 at which the input signal $S_{IN}$ assumes the off-level, or even before this time t0.

The transistor 1 together with the voltage protection circuit 3 forms a control loop that, when the voltage protection circuit 3 is activated, controls the on-state of the transistor 1 such that the gate-drain-voltage $V_{DG}$, which is approximately equal to the drain-source-voltage $V_{DS}$, is limited to the maximum voltage value.

In order to prevent instabilities, in particular to prevent a positive thermal feedback as explained with reference to FIG. 1, the voltage protection circuit 3 is deactivated before the load current $I_{DS}$ and before the gate-source-voltage $V_{GS}$ decrease to zero. In the timing diagram of FIG. 5, t3 is the time at which the voltage protection circuit 3 is deactivated. At this time, the gate-source-voltage $V_{GS}$ rapidly decreases to zero. Since the energy stored in the inductive load has not been completely dissipated at this time t3, the load-path voltage $V_{DS}$ increases until an avalanche voltage $V_{AV}$ of the transistor 1 is reached at which an avalanche breakthrough sets in which allows the load current $I_{DS}$ to further flow and to decrease to zero. At time t4 the load current $I_{DS}$ has decreased to zero. At this time, the load-path voltage $V_{DS}$ equals the supply voltage Vbb and the load voltage $V_Z$ is zero.

The control circuit 4 is configured to deactivate the voltage protection circuit 3 dependent on at least one operation parameter of the transistor 1. The at least one operation parameter is the gate-source-voltage $V_{GS}$, the load current $I_{DS}$, the slope of the gate-source-voltage $V_{GS}$, the slope of the load current $I_{DS}$, or a duration of an off-time of the input signal $S_{IN}$. According to one embodiment, the control circuit 4 deactivates the voltage protection circuit 2 when the gate-source-voltage $V_{GS}$ reaches or falls below a threshold voltage and/or when the load current $I_{DS}$ reaches or falls below a threshold current.

Figure 6:
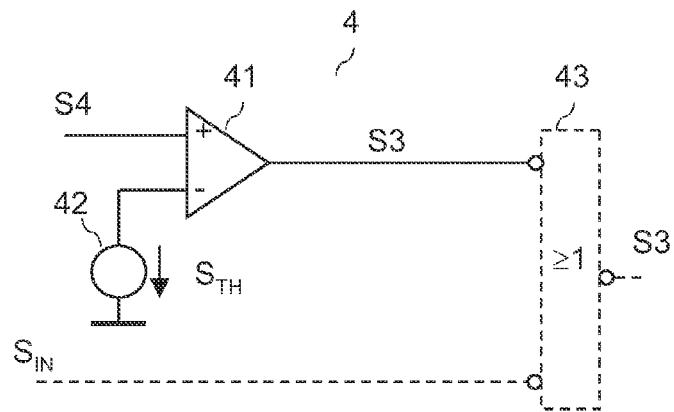
FIG. 6 schematically illustrates a first embodiment of the control circuit.

FIG. 6 illustrates an embodiment of a control circuit 4 that deactivates the voltage protection circuit 3 when the operation parameter S4 falls below a threshold. The control circuit 4 includes a comparator 41 that compares the operation parameter or, more precisely, the value of the operation parameter S4 with a threshold or reference value $S_{TH}$ provided by a reference signal source 42. The control signal S3 is available at the output of the comparator 41. In the embodiment illustrated in FIG. 6, in which the reference signal $S_{TH}$ is received at an inverting input of the comparator 41 and the operation parameter S4 is received at a non-inverting input, the control signal S3 assumes a low level that deactivates the control circuit 3 when the operation parameter S4 falls below the threshold $S_{TH}$.

According to one embodiment, the transistor 1 has a temperature stable point represented by a drive voltage $V_{GS0}$, as explained with reference to FIG. 1, and the threshold $S_{TH}$ is above this temperature stable point, so that the voltage protection circuit 3 is deactivated before the transistor 1 can be operated below the temperature stable point.

Optionally, the control signal S3 is also dependent on the input signal $S_{IN}$ such that the control signal S3 may assume a signal level that deactivates the voltage protection 3 only when the input signal $S_{IN}$ has an off-level. For this, the output signal of the comparator 41 and the input signal $S_{IN}$ may be fed to a logic gate 43 that provides the control signal S3. The logic gate 43 may be a NOR-gate with two inverting input terminals that generates a low output signal S3 that deactivates the voltage protection circuit 3 only when the comparator signal S3 and the input signal $S_{IN}$ have a low level.

Conventional voltage measurement and current measurement devices may be used to measure the gate-source-voltage $V_{GS}$ or the load current $I_{DS}$ and provide signals representing this voltage or this current to the control circuit 4. These measurement devices are not illustrated in FIG. 2.

When the operation parameter S4 represents the gate-source-voltage $V_{GS}$, the threshold value $S_{TH}$ is, for example, between 2V and 2.5V. When the operation parameter S4 represents the load current $I_{DS}$, the threshold value $S_{TH}$ is, for example, between 10 A and 200 A, in particular between 50 A and 150 A, dependent on the current bearing capability of the transistor 1.

According to a further embodiment, the control circuit 4 evaluates a slope $dV_{GS}/dt$ of the gate-source-voltage $V_{GS}$ and/or the slope $dI_{DS}/dt$ of the load current $I_{DS}$ and deactivates the voltage protection circuit 3 when absolute values of these slopes reach or fall below corresponding threshold values.

According to one embodiment, the threshold values compared with one of the operation parameters explained above are dependent on a temperature of the transistor 1. For this, the control circuit 4 additionally receives a temperature signal that is representative of the temperature.

Figure 7:
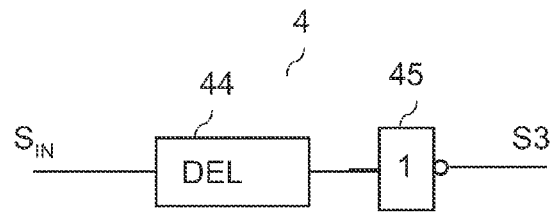
FIG. 7 schematically illustrates a second embodiment of the control circuit.

According to a further embodiment illustrated in FIG. 7, the control circuit 4 is configured to detect the time t0 at which the input signal $S_{IN}$ assumes an off-level and deactivates the voltage protection circuit 3 after a given delay time after time t0. For this, the control circuit 4 includes a delay element 44 that receives the input signal $S_{IN}$. The delay element 44 is configured to delay that edge of the input signal $S_{IN}$ that represents switching off the transistor 1. This slope is, for example, the falling edge. An optional inverter 45 generates the control signal S3 from an output signal of the delay element 44.

Of course, a deactivation of the protection circuit 3 can be performed dependent on two or more of the operation parameters explained above.

According to one embodiment, the transistor 1 and the Zener or avalanche diode 31 of the voltage protection circuit 3 are implemented in a common semiconductor body. An embodiment for implementing the transistor 1 and an avalanche diode 31 in a common semiconductor body 100 is illustrated in FIG. 8 which schematically illustrates a horizontal cross sectional view of such a semiconductor body 100.

Figure 8:
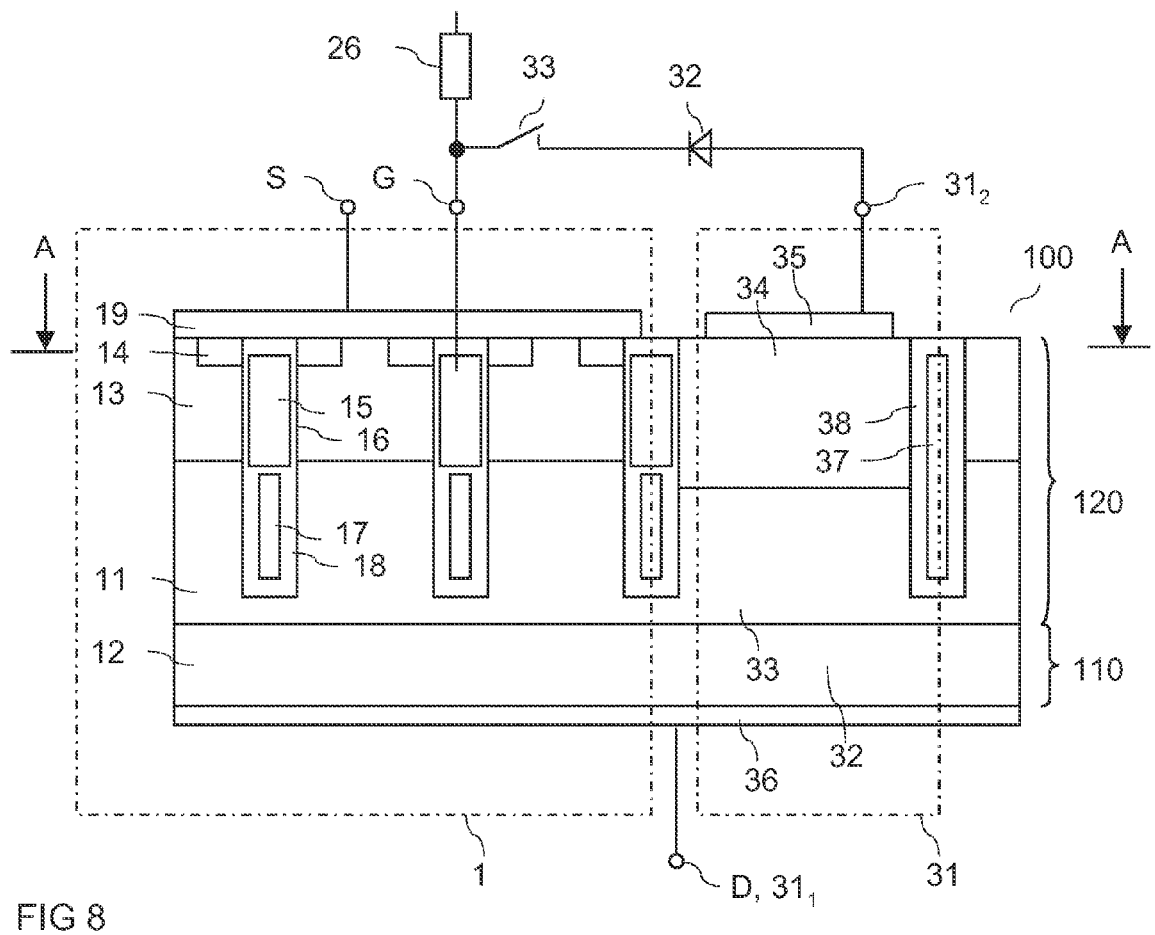
FIG. 8 schematically illustrates a vertical cross sectional view of a semiconductor body in which the transistor and a diode of the voltage protection circuit are implemented.

In the embodiment illustrated in FIG. 8, the transistor 1 is implemented as a vertical transistor with a drift region 11, a body region 13 adjoining the drift region 11 and arranged between the drift region 11 and a source region 14. The drift region 11 is arranged between the body region 13 and a drain region 12. The transistor 1 further includes a gate electrode 15 which extends along the body region 13 between the source region 14 and the drift region 11 and which is dielectrically insulated from the body region 13 by a gate dielectric 16. Optionally, a field electrode 17 is arranged in the drift region 11 and is dielectrically insulated from the drift region 11 by a field electrode dielectric 18. The field electrode 17 may be electrically connected to the gate electrode 15 or to the source region 14 or a source electrode 19 which is electrically connected to the source region 14 and the body region 13. In the transistor 1 in FIG. 8, the gate electrode 15 is implemented as a trench electrode which is an electrode arranged in a vertical trench formed in the semiconductor body 100. The source region 14 and the drain region 12 are arranged distant to each other in the vertical direction of the semiconductor body 100, where the body region 13 and drift region 11 are arranged between the source region 14 and the drain region 12 in the vertical direction.

For explanation purposes it is assumed that the transistor 1 is an n-type MOSFET in which the drain region 12, the drift region 11 and the source region 14 are n-doped, while the body region 13 is p-doped.

The avalanche diode 31 which is also implemented in the semiconductor body 100 is implemented as a pin diode with a first emitter region 32, a second emitter region 34 and a base region 33 arranged between the two emitter regions 32, 34. The first emitter region 32 of the diode and the drain region 12 of the MOSFET 1 are formed by a common doped semiconductor region.

This common semiconductor region is, for example, a semiconductor substrate 110 on which an epitaxial layer 120 is arranged. The drift region 11, the body region 13 and the source region 14 of the MOSFET 1 are implemented in the epitaxial layer 120. In this case, the drift region 11 has a doping concentration which corresponds to a basic doping concentration of the epitaxial layer 120, while the body region 13 and the source region 14 are implanted and/or diffused semiconductor regions.

The base region 33 of the avalanche diode 31 has a lower doping concentration than the first and second emitter regions 32, 34 and may have a doping concentration corresponding to the drift region 11. The second emitter region 34 is, for example, an implanted or diffused semiconductor region. The drain region 12 and the first emitter region 32 are electrically connected to a first electrode 36 which forms a drain terminal D and a first terminal $31_1$ of the voltage protection circuit 3. A second electrode 35 is electrically connected to the second emitter region 34. The second electrode 35 forms a second terminal $31_2$ of the voltage protection circuit 3.

The avalanche voltage of the diode 31 is, amongst others, defined by the a length of the base region 33. In the embodiment illustrated in FIG. 8, the length of the base region 33 is the dimension of the base region 33 in the vertical direction. The length of the base region 33 can be defined by the depth of the second emitter region 34, which, in the embodiment of FIG. 8, extends deeper into the semiconductor body 100 than the body region 13 of the MOSFET 1.

The transistor 1 may be implemented with a plurality of identical transistor cells that are connected in parallel. Each of these transistor cells includes a source zone 14, a body region 13, a gate electrode 15 and an optional field electrode 17, where two neighboring transistor cells may have a gate electrode or gate electrode section in common. The individual transistor cells are connected in parallel as the individual gate electrodes 15 are connected to a common gate terminal G and as the source regions 14 are connected to the source electrode 19. The drain region 12 and the drift region 11 are common to the individual transistor cells.

The drift region 11 of the transistor 1 may adjoin the base region 33 of the diode 31 in a lateral direction of the semiconductor body 100. The body region 13 of the transistor 1 and the second emitter region 34 of the diode 31 are separated in the lateral direction of the semiconductor body 100 by one of the trenches including a gate electrode 15 and an optional field electrode 17. Optionally, only the field electrode 17 is arranged in the trench between the body region 13 and the second emitter region 34. According to another embodiment, the trench separating the body region 13 and the second emitter region 34 is only filled with a dielectric.

Figure 9:
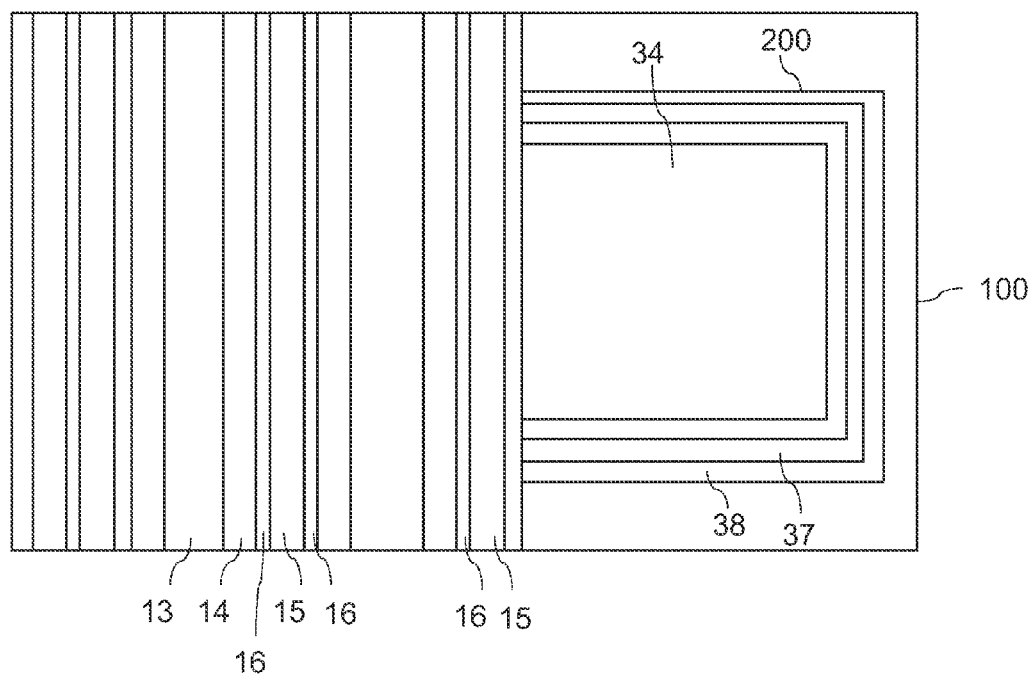
FIG. 9 schematically illustrates a horizontal cross sectional view of a semiconductor body in which the transistor and a diode of the voltage protection circuit are implemented.

Referring to FIG. 9 which shows a horizontal cross sectional view of the semiconductor body 100, the base region 33 and the second emitter region 34 of the diode 31 are surrounded by a trench 200. The trench 200 may include a field electrode 37 and a dielectric 38 insulating the field electrode 37 from the semiconductor body 100 or may be completely filled with a dielectric. In the region between the diode 31 and the transistor 1, a gate electrode 15, as illustrated in FIG. 8, may be arranged in the trench 200.

For illustration purposes, the other components of the voltage protection circuit 3, namely the switching element 33 and the rectifier element 32, as well as the output resistor 26 of the drive circuit 2 are schematically illustrated in FIG. 8.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit, comprising:
a transistor having a control terminal to receive a drive signal, and a load path between a first and a second load terminal;
a voltage protection circuit coupled to the transistor and having a control input, the voltage protection circuit configured to assume one of an activated state and a deactivated state as an operation state dependent on a control signal received at the control input and configured to limit a voltage between the load terminals or between one of the load terminals and the control terminal; and
a control circuit coupled to the control input of the voltage protection circuit and configured to deactivate the voltage protection circuit dependent on at least one operation parameter of the transistor and when a voltage across the load path or a load current through the load path is other than zero,
wherein the control circuit is further configured to compare a value of the operation parameter with a threshold value and to deactivate the voltage protection circuit dependent on the comparison result,
wherein the control circuit is further configured to detect a temperature of the transistor, and
wherein the threshold value is dependent on the detected temperature.

2. The electronic circuit of claim 1, wherein the at least one operation parameter is: an amplitude of the drive signal; a slope of the drive signal; an amplitude of the load current through the load path; a slope of the load path; and the duration of an on-level of the drive signal.

3. The electronic circuit of claim 1, wherein the control circuit is further configured to deactivate the voltage protection circuit dependent on the drive signal.

4. The electronic circuit of claim 1, wherein the voltage protection circuit is coupled between one of the load terminals and the control terminal and is configured to limit, in the activated state, the voltage between these terminals to a given voltage value.

5. The electronic circuit of claim 4, wherein the voltage protection circuit comprises at least one first diode coupled between the control terminal and the at least one load terminal and having a breakthrough voltage defining the given voltage value.

6. The electronic circuit of claim 5, wherein the voltage protection circuit further comprises a switching element connected in series with the at least one first diode and controlled by the control signal.

7. The electronic circuit of claim 5, wherein the transistor and the at least one first diode are implemented in a common semiconductor body.

8. The electronic circuit of claim 7, wherein the transistor and the at least one first diode have a load terminal in common.

9. A method of driving a transistor having a control terminal to receive a drive signal, a load path between a first load terminal and a second load terminal, and an avalanche breakthrough voltage, the method comprising:
switching off the transistor and limiting a voltage between the load terminals or between one of the load terminals and the control terminal to a threshold voltage below the avalanche breakthrough voltage by driving the transistor in an on-state;
deactivating the voltage limiting dependent on an operation parameter of the transistor and before a voltage across the load path or a load current through the load path has decreased to zero, including comparing a value of the operation parameter with a threshold value and deactivating the voltage limiting dependent on the comparison result;
detecting a temperature of the transistor; and
adjusting the threshold value dependent on the detected temperature.

10. The method of claim 9, wherein the at least one operation parameter is: an amplitude of the drive signal; a slope of the drive signal; an amplitude of the load current through the load path; a slope of the load path; and the duration of an on-level of the drive signal.

11. The method of claim 9, further comprising deactivating the voltage limiting dependent on the drive signal.

12. The method of claim 9, further comprising limiting the voltage between one of the load terminal and the control terminal to a given voltage value.

13. The method of claim 12, wherein limiting the voltage between one of the load terminal and the control terminal comprises connecting at least one first diode coupled between the at least one load terminal and the control terminal, the at least one diode having a breakthrough voltage defining the given voltage value.

14. The method of claim 13, wherein a switching element is connected in series with the at least one first diode, and the voltage limiting is dependent on a switching state of the switching element.

15. The method of claim 13, wherein the transistor and the at least one first diode are implemented in a common semiconductor body.

16. The method of claim 15, wherein the transistor and the at least one first diode have a load terminal in common.

* * * * *